May 6, 1969 WEI K. TSANG ET AL 3,443,173

NARROW EMITTER LATERAL TRANSISTOR

Filed May 17, 1966

United States Patent Office 3,443,173

Patented May 6, 1969

3,443,173

NARROW EMITTER LATERAL TRANSISTOR

Wei K. Tsang and Karl M. Busen, Williamstown, Mass., assignors to Sprague Electric Company, North Adams, Mass., a corporation of Massachusetts Filed May 17, 1966, Ser. No. 550,696

Int. Cl. H01l *11/10, 15/00*

U.S. Cl. 317—235 5 Claims

ABSTRACT OF THE DISCLOSURE

Diffused P-type emitter and collector regions are closely spaced in an N-type body at a major surface thereof. The highest useful lateral injection is provided by an emitter which has a lateral area much greater than its planar area, and a collector which has a lateral area at least as great as the emitter lateral area. The N-type body is treated to provide high charge carrier lifetime so as to reduce vertical injection from the emitter.

This invention relates to an improved lateral transistor in a semiconductive body. More particularly this invention relates to structure parameters which improve the performance of a lateral transistor.

PNP planar transistors of the prior art that are formed so as to permit connections from a major surface present a problem of conductivity inversion at the surface when certain easily available materials are used. Such inversion consists of a change in conductivity, and possibly in some instance a change in conductance type, within a very thin layer adjacent to the surface of the semiconductive body. Planar silicon PNP transistors are particularly prone to this inversion, and its avoidance requires involved processing steps.

Lateral transistors of the prior art that are formed in a surface of a monolithic semiconductive body to permit connections to the transistor at a major surface of the body are not affected by this inversion problem. Lateral transistors have the emitter-base and collector-base junctions formed in the major surface of an opposite conductivity type body in a flanking arrangement with each other. The important electronic current between these junctions flows laterally from the emitter across an interposed part of the opposite conductivity type and laterally to an elongated section of the collector junction area. The intervening semiconductive body forms the base region of the lateral transistor.

In the fabrication of the lateral type transistor, the emitter and collector junctions are formed by introducing a suitable impurity into a semiconductive body at its major surface to produce regions of the opposite conductivity type. The impurity diffusion forms a smaller emitter region with a larger collector region so that a section of the collector junction area is presented for current flowing laterally to the collector junction.

Lateral transistors of the PNP silicon variety have previously been limited in the extent to which their principal optimum parameters can be substantially improved.

It is an object of this invention to provide a lateral transistor having improved gain and frequency characteristics.

It is another object of this invention to provide a lateral transistor having a gain of better than unity.

Still another object of this invention is to provide a lateral transistor having satisfactory high frequency performance.

Figure 1:
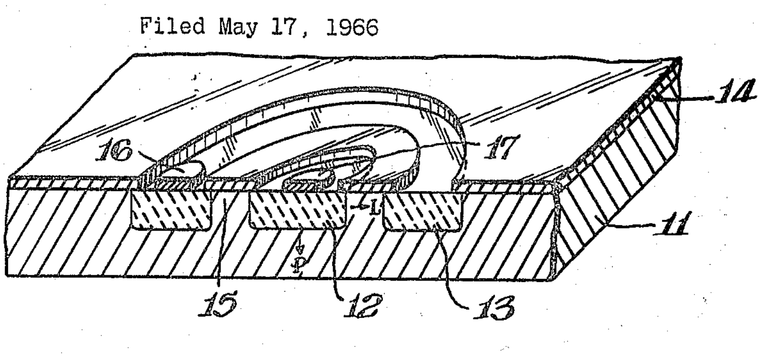
Figure 2A:
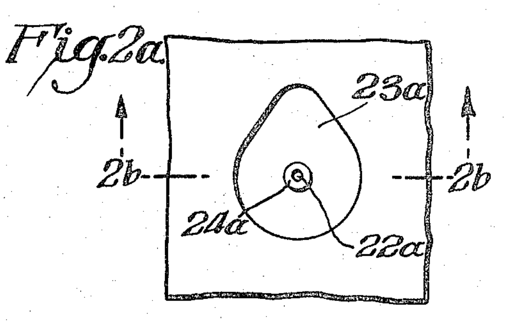
Figure 2B:
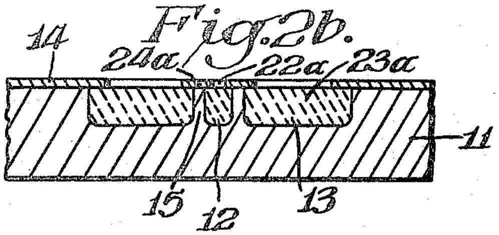
Figure 3A:
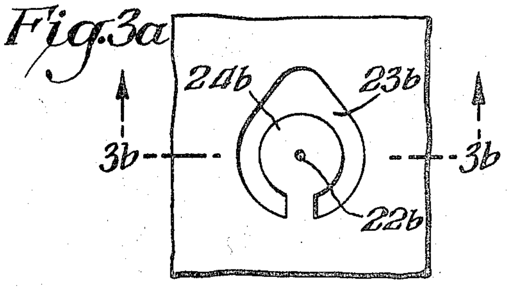
Figure 3B:
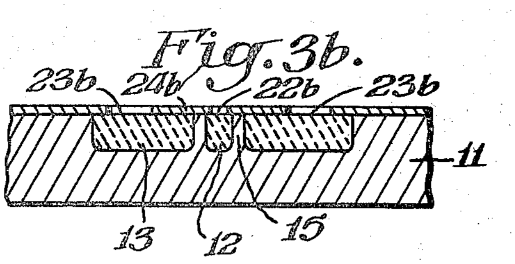
Figure 4A:
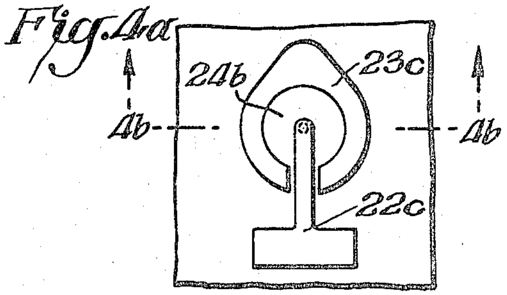
Figure 4B:
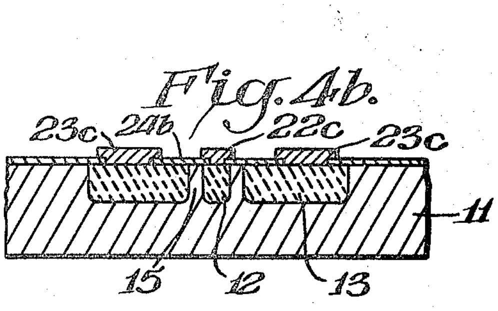
Figure 5A:
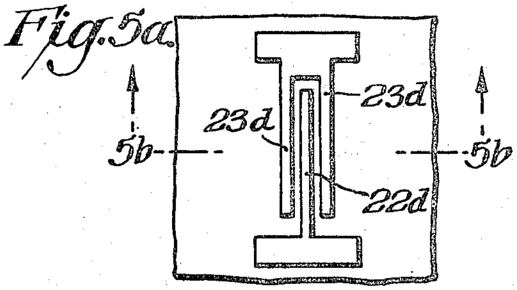
Figure 5B:
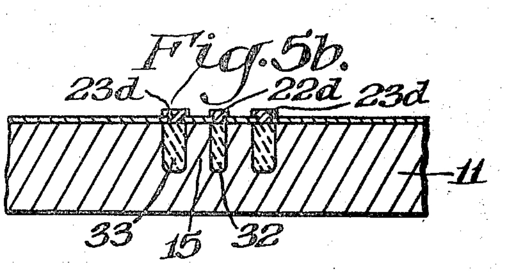

These and other objects of this invention will become more apparent upon consideration of the following description taken in conjunction with the accompanying drawings, in which:

FIGURE 1 shows the structure of a laterial transistor by a perspective view;

FIGURES 2*a* and 2*b* are plan and sectional views of a stage in the fabrication of a ring-shaped transistor according to the invention;

FIGURES 3*a* and 3*b* are plan and sectional views of a ring-shaped transistor according to the invention;

FIGURES 4*a* and 4*b* are plan and sectional views of a completed ring-shaped transistor according to the invention; and, FIGURES 5*a* and 5*b* are plan and sectional views of a completed striped shape transistor according to this invention.

Referring to the drawing, wherein like numbers indicate similar parts, the lateral transistor of the prior art is shown in FIGURE 1 wherein an N-type silicon body 11 contains a disc-shaped P-type emitter region 12, which is surrounded by a ring-shaped collector region 13. A space 15 provided between collector 13 and emitter 12 acts as a base region. By proper contact formation, this structure is operable as a transistor.

The emitter region 12 is terminated by a junction which is oriented principally in two directions as indicated by L and P in the sectional showing in FIGURE 1. These directions are the lateral and the planar directions, respectively. In the lateral direction the emitter lateral junction area is oriented normal to the major surface, and similar in general to the vertical dimension. In the planar direction the emitter planar junction area is oriented parallel to the major surface, and similar in general to the horizontal dimension.

The preparation of such a lateral transistor is simple. A silicon oxide layer 14 is formed on the suface of the silicon body 11 by a thermal growth process, windows for emitter and collector diffusion areetched by a photoresist process, and the emitter and collector regions 12 and 13 are formed by bringing into the silicon body 11 an impurity which can provide within these regions a conductivity-type opposite to that of the bulk of the body 11. This means that if, e.g., the bulk is N-type, the impurity must consist of acceptors which make the emitter and collector regions 12 and 13 hole-conducting. Collector region 13 is provided with a suitable contact 16, and emitter region 12 is provided with a suitable contact 17. Inversion prevention results from forming the emitter and collector at the same time and forming a high concentration at the surface of the impurity forming the emitter and collector. As a result, inversion of the P-type region is very unlikely in the neighborhood of that surface.

Without the proper design and preparation as disclosed in this application, the common emitter D.C. current gain of the lateral PNP transistor is not high, typically around unity. Another limitation is found in the poor high-frequency performance. There have been efforts to circumvent some of the problems by amplifying the collector current of this PNP transistor with an NPN transistor, so that the combined current gain is made comparable to that of the NPN in the same body. While this combination exhibits improvements over the above-mentioned single lateral transistor, the combination itself is undesirable. It is a feature of this invention relating to the lateral structure that an improved lateral transistor is obtained which has performance characteristics comparable to a conventional transistor.

This improvement is achieved by forming in a crystalline semiconductive body the emitter and collector regions which are terminated by junction areas almost entirely oriented in the lateral and planar directions and by observing that for the emitter region a ratio of the lateral to planar junction area is as large as possible.

Current flows laterally to the collector junction, and parts of the collector junction areas and the emitter junction area are face to face, so that current flows across the intervening base region. It is, furthermore, essential for the invention that the recombination of carriers with opposite charge is controlled only by the interior parts of the semiconductive body, and not by its surface. It is of further importance that the collector has a lateral junction area which is at least as large as the lateral junction area of the emitter.

The improved lateral transistor exhibits a common emitter D.C. current gain, $h_{FE}$, which is substantially larger than 1. It is a feature of this invention that the $h_{FE}$ is substantially increased by providing for the emitter the large lateral to planar junction area ratio, and by controlling the recombination of the charge carriers only by the interior parts of the semiconductive body. This feature results from a novel combination of new discoveries with conventional transistor theory. The following detailed discussion outlines the operation of the above-noted parameters in the device of this invention.

For a transistor, the common base current gain is defined as the product of emitter injection efficiency $\gamma$, base transport $\beta$, collector efficiency and of the multiplication factor. Assuming that the collector efficiency and the multiplication factor are nearly one, only the emitter efficiency $\gamma$ and the base transport factor $\beta$ are influential on the performance, and for good characteristics they should be close to 1.

It has been found from experimentation and from application of theoretical considerations that $\gamma$ for the lateral PNP transistor can be expressed as:

$$\gamma=\frac{J_p}{J_p+J_n+FJ_p'} \qquad (1)$$

where $J_p$ is the current density of holes injected from the lateral junction area of the emitter-base junction, $J_n$ is the current density of electrons injected into the lateral junction area of the emitter-base junction, $J_p'$ is the current density of the holes injected from the planar junction area of the emitter-base junction where the holes are injected into the semiconductive body, and F is a geometrical factor. By minimizing F and $J_p'$ or by eliminating $J_p'$ the emitter efficiency is maximized.

F, which represents the ratio of planar junction area to lateral junction area may be reduced by decreasing the planar junction area while maintaining the lateral junction area, or increasing the lateral junction area while maintaining the planar junction area. $J_p'$, which is defined here as parasitic hole current density, can be minimized by increasing the lifetime of the charge carriers in the bulk. This is seen by the application of the diode equation to the planar junction area of the emitter junction which shows that $J_p'$ is inversely proportional to the square root of the lifetime of the injected holes, $\tau_p$.

It has been discovered that an increase in carrier lifetime favorably affected the base transport factor, namely, that $\beta$ was close to 1 as measured from devices prepared according to the invention. With $\beta$ close to 1, we can write the following equation for the common emitter D.C. current gain:

$$h_{FE}=\frac{\gamma}{1-\gamma} \qquad (2)$$

From this equation can be calculated the influence of the junction area ratio and of the carrier lifetime.

The high frequency performance of the device of this invention may be considered in terms of the common-emitter current gain, $h_{fe}$. This performance is characterized by the gain-bandwidth product $f_t$ and by the 3 db cut-off frequency $f_{-3\ db}$. The $f_t$ and $f_{-3\ db}$ decrease when F is increased, while $f_{-3\ db}$ also decreases as $\tau_p$ is increased. Therefore, for a structure of a given specific performance, the carrier lifetime has to be tailored in such a way that current gain $h_{FE}$, gain-bandwith product $f_t$, and 3 db cut-off frequency, $f_{-3\ db}$, are balanced for optimal conditions.

A less critical current gain can permit sacrificing $h_{FE}$ in favor of the gain-bandwidth product $f_t$ and 3 db cut-off frequency $f_{-3\ db}$. This may be accomplished by decreasing the carrier lifetime. The current gain, the gain-bandwidth, and the 3 db cut-off frequency are all improved by eliminating the current of holes injected from the planar emitter junction area into the semiconductive body.

By reducing the ratio of the planar emitter junction area to the lateral junction area, and by reducing the current density of the holes injected from the planar junction area, it has been discovered that the emitter efficiency can be improved. Another feature of this discovery is that the slope of $h_{fe}$ plotted against frequency for this device was one-half instead of 1 as expected in conventional transistors.

It has been experienced that the relationship between the lateral junction area and the planar junction area can be controlled by the geometric pattern of the windows through which the impurity transport is taking place in producing the units.

It is important to the quality of the device that the surface recombination of the charge carriers be minimized with respect to the charge carrier recombination in the regions within the semiconductive body. It has been discovered that this desirable feature can be achieved by suitable processes in the production of the device of this invention which provides an interface between the surfaces of the silicon body and the passivating silicon oxide layer exhibiting a recombination velocity so much less than the recombination of the elements in the base region of the lateral transistor as to make the recombination at the interface negligible.

The control of lifetime in the bulk can be exerted by observation of the proper processing steps and, if necessary, addition of an agent which is active with respect to the carrier lifetime, that means which either raises or lowers the carrier lifetime normally existent in the presence of impurities only.

In the following description, processing steps are set forth which provide the above-mentioned controls. This description of these steps is merely illustrative, not limitative, and should, therefore, in no way be considered as a restriction, for other processing steps may lead to identical device characteristics employing the operation of this invention. In the following examples, the formation of the emitter and the collector is brought about by diffusion. Similarly alloying or other suitable processes may be used to obtain the wanted performance. By the same token, one should consider the ring-shaped geometry as shown in FIGURES 1 and 2 only as an illustration. Other geometries, e.g., the one shown in FIGURE 5 where 32 and 33 are the contacted emitter and collector respectively, may well serve the same purpose of the invention.

*Example 1*

A method of making the improved lateral transistor of this invention comprises as processing steps the formation of a silicon oxide layer on the surface of a silicon body by a thermal growth process, the etching of windows for emitter and collector by a photo-resist process, the formation of emitter and collector regions by diffusion of an impurity, and the annealing by application of various heating steps.

For formation of the silicon oxide layer, a silicon slice is put into a furnace which contains either a wet or dry oxygen atmosphere and is kept there at 1100°–1250° C. (pref. 1200° C.) for so long a time that the oxide is thick enough to fulfill a specific purpose as masking against impurities during diffusion or exhibiting the proper electrical breakdown characteristics. A typical time range is 15–420 minutes. After oxidation, emitter and collector windows are etched by a photoresist process. These windows may have a shape as indicated by **22*a* and 23*a*** in FIGURE 2.

The subsequent step, called predeposition, may consist of exposing the slice to a $B_2H_6+O_2+N_2$ atmosphere, so that by this step and subsequent ones the wanted impurity profile is obtained. Typical values for the predeposition are 1100 to 1150° C. and ten to sixty minutes. A following high-heating step will take care of annealing out some damage which has been introduced into the silicon body during the predeposition and will drive the predeposited impurity further in by diffusion. Typical values for the high-heating step are 1000–1200° C. (pref. 1100° C.) and 10–60 minutes (pref. 20). After this, a cooling step is applied, which is extended over 10–60 minutes (pref. 15). This cooling step is beneficial insofar as it prevents the formation of unwanted imperfections. It is understood here that imperfections are structural defects in the silicon body, but that impurities and lifetime active agents at substitutional sites of the silicon lattice are not classified as imperfections.

The final treatment consists of a medium-heating step at 300°–900° C. (pref. 900° C.) for one to five hours (pref. two), followed by another cooling step over a 10–60 minute (pref. 15) period. All the steps which are applied after predeposition are essential for the device performance, especially for the control of the recombination velocity at the interface. They are summarized by the term "annealing." With the geometry as shown in FIGURE 2 and an emitter diameter of 0.5 mil, the penetration along the lateral orientation is 0.1 mil. The geometric base width is 0.05 mil and the collector has an inner diameter of 10 mils with a lateral penetration of 0.1 mil. The electrical base width is less than 1 micron. The above described process yields improved lateral transistors with $h_{FE}$ as high as 30 and a collector reverse current, $I_{CES}$, of several pico amperes at $V_{CE}=15$ v.

*Example 2*

This example describes how control of the carrier lifetime in the bulk can be obtained by suitable additional processing steps.

A. If one wants to increase the lifetime, a nickel diffusion can be used. For the preparation of an improved lateral transistor, a sample is subjected to all processing steps as described in Example 1, however, the predeposition is followed by electroless plating of nickel on the back of the slice and subjecting the sample then to annealing as described in Example 1. Typical values which were measured for such a device are:

$h_{FE}=25$ at $V_{CE}=10$ v., $I_c=1$ ma.
$f_t=30$ mc./s. at:
$V_{CE}=10$ v.
$I_c=1$ ma.
$f_{-3\ db}=200$ kc./s. at:
$V_{CE}=10$ v.
$I_c=1$ ma.

B. In this procedure the carrier lifetime in the bulk will be decreased by gold diffusion. This objective is achieved by going through all steps, including the predeposition, as described in Example 1, and then vaporizing a thin gold layer onto the back of the silicon slice. In a subsequent step, the gold is distributed by heating the sample in a pure nitrogen atmosphere until one has a satisfactory lifetime. This can be achieved by heating at 850° C. to 1100° C. for 20–60 minutes. This step is followed by a rapid quenching. Typical characteristics measured for the device prepared in this way are:

$h_{FE}=3.5$ at:
$V_{CE}=10$ v.
$I_c=1$ ma.
$f_t=30$ mc./s. at:
$V_{CE}=10$ v.
$I_c=1$ ma.
$f_{-3\ db}=5$ mc./s. at:
$V_{CE}=10$ v.
$I_c=1$ ma.

In all examples above, the annealing is carried out in a pure nitrogen atmosphere. For some applications a stripe-shaped geometry as illustrated in FIGURE 5 may be advantageous, for this geometry can handle a higher current and thus a higher power dissipation. When these devices were manufacture, current gains between 30 and 50 were observed. This is obviously a considerable improvement over the devices which formerly had current gains near unity. Controlling the charge carrier lifetime in conjunction with the other features, furthermore, opens the door for a variety of other applications.

In FIGURES 2*a* and 2*b*, 3*a* and 3*b*, 4*a* and 4*b* the processing of an improved lateral transistor according to this invention is illustrated. FIGURES 2*a* and 2*b* show a structure after the windows for the emitter and collector have been etched as described in Example 1. **22*a* is the emitter window in the silicon oxide layer 14, and 23*a* is the collector window in the layer 14. The silicon oxide ring 24*a* formed around the emitter 22*a* protects the silicon body from impurity diffusion which is applied to the sample and by which the transistor is formed. The impurity diffusion provides the emitter region 12 and the collector region 13 in the silicon body 11 which provides the base region 15 between the emitter 12 and collector 13**.

After boron predeposition and subsequent "drive-in" the whole surface of the sample is covered by an oxide **24*b*** as illustrated in FIGURES 3*a* and 3*b*. For contact formation windows **22*b* and 23*b* are cut into this oxide. 22*b* is the opening for the emitter 12 and 23*b* is the opening for the collector 13**. The sample is then subjected to annealing to achieve the required electrical characteristics.

In a subsequent step a metal, e.g., aluminum, is evaporated onto the structure and then the structure is etched so that the structure shown in FIGURES 4*a* and 4*b* is left. **22*c* is the contact for the emitter 12. 23*c* is the contact for the collector 13**. The contact for the base, not shown here, can be applied at suitable places on the N-type silicon bulk.

In FIGURES 5*a* and 5*b* the improved lateral transistor according to this invention is illustrated in a modified shape. An emitter region 32 and a collector region 33 are provided in the silicon body 11 by impurity diffusion. The emitter region 32 has a long narrow portion as shown in FIGURES 5*a* and 5*b*. The collector region 33 has a pair of long narrow portions in the silicon body 11 at each of the elongated portion of emitter 32. These elongated portions of the emitter region 32 and collector region 33 have between them the base region 15. Suitable contacts **22*d* and 23*d* for the emitter and collector may be applied to the regions 32 and 33**.

Previously the PNP lateral transistor of the prior art was used in conjunction with a conventional NPN transistor. Among other advantages, the PNP lateral transistor of this invention exhibits adequate gain to function individually as a conventional transistor. Broadly the structure of this invention provides a high performance PNP transistor in silicon, using minimum of masking steps and the process is compatible with present monolithic processes.

Although the above description refers specifically to a PNP type transistor, it will be appreciated that it is equally applicable to NPN type transistors. While the above description contains illustrations of the invention it will be understood that modifications of the embodiment as set forth are possible and it will be understood that the scope is intended to be limited only by the appended claims.

What is claimed is:

1. An improved PNP lateral transistor comprising a monocrystalline N-type semiconductive body having a major planar surface, diffused P-type emitter and collector regions being closely spaced in said body at said surface, said emitter region forming a junction with said body, wherein said junction terminates only on said surface and has a lateral portion parallel to said surface and a planar portion normal to said surface, and wherein the ratio of the emitter lateral junction area to the emitter planar junction area is as large as possible for a lateral junction area of the collector at least as great as said emitter lateral junction area, said body being provided with high charge carrier lifetime and the portion of said body between said emitter and said collector being a base region having an extremely narrow electrical base width whereby charge carrier recombination takes place solely in the regions within said semiconductive body.

2. An improved lateral transistor as defined in claim 1 wherein the lifetime of the charge carriers within said semiconductive body is increased by the addition of a lifetime-increasing agent.

3. An improved lateral transistor as defined in claim 2 wherein said agent is nickel.

4. An improved lateral transistor as defined in claim 1 wherein said emitter and collector regions are ring-shaped, the emitter region being surrounded by the collector region.

5. An improved lateral transistor as defined in claim 1 wherein said emitter and collector regions are stripe-shaped, the lateral part of said emitter region being confronted on both sides by the collector region.

References Cited

UNITED STATES PATENTS

| | | | |
|---|---|---|---|
| 2,827,599 | 3/1958 | Jochems | 317—235.40 |
| 2,964,689 | 12/1960 | Buschert et al. | 317—235.40 |
| 3,225,272 | 12/1965 | Cronemeyer | 317—235.40 |
| 3,246,214 | 4/1966 | Hugle | 317—235.40 |

JOHN W. HUCKERT, *Primary Examiner.*

J. D. CRAIG, *Assistant Examiner.*

U.S. Cl. X.R.

148—187